United States Patent
Mason et al.

(10) Patent No.: US 9,356,144 B1
(45) Date of Patent: May 31, 2016

(54) REMOTE GATE PROTECTION DIODE FOR FIELD EFFECT TRANSISTORS

(75) Inventors: Philip Mason, Greensboro, NC (US); Daniel Charles Kerr, Oak Ridge, NC (US); Michael Carroll, Jamestown, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 452 days.

(21) Appl. No.: 12/854,563

(22) Filed: Aug. 11, 2010

Related U.S. Application Data

(60) Provisional application No. 61/233,027, filed on Aug. 11, 2009.

(51) Int. Cl.
*H01L 23/62* (2006.01)
*H01L 29/78* (2006.01)

(52) U.S. Cl.
CPC .................................. *H01L 29/7841* (2013.01)

(58) Field of Classification Search
CPC ............. H01L 2224/48463; H01L 2224/4847; H01L 2224/80; H01L 2224/82106; H01L 2224/8211
USPC .................. 257/328, 347, 355–360, 363, 364
See application file for complete search history.

(56) References Cited

U.S. PATENT DOCUMENTS

| | | | | |
|---|---|---|---|---|
| 3,555,374 | A * | 1/1971 | Usuda ................. | H01L 27/0255 148/DIG. 145 |
| 3,754,171 | A * | 8/1973 | Anzai et al. .................... | 257/363 |
| 4,607,274 | A * | 8/1986 | Yoshitake ..................... | 257/357 |
| 5,489,792 | A * | 2/1996 | Hu et al. ........................ | 257/347 |
| 6,341,087 | B1 * | 1/2002 | Kunikiyo ................. | 365/189.09 |
| 6,542,346 | B1 * | 4/2003 | Chen et al. .................... | 361/111 |
| 2001/0040479 | A1 * | 11/2001 | Zhang ................. | H03K 17/687 327/427 |
| 2006/0009164 | A1 * | 1/2006 | Kataoka ................ | H04B 1/525 455/83 |
| 2009/0072315 | A1 * | 3/2009 | Hodel et al. ................... | 257/356 |

OTHER PUBLICATIONS

Chang, M.C. et al., "Degradation of MOS Transistor Characteristics by Gate Charging Damage During Plasma Processing," VLSI Technology, Systems and Applications, Proceedings of Technical Papers, 1993, pp. 320-324, IEEE.

(Continued)

*Primary Examiner* — Howard Weiss
*Assistant Examiner* — Sue Tang
(74) *Attorney, Agent, or Firm* — Withrow & Terranova, P.L.L.C.

(57) ABSTRACT

The present disclosure relates to gate oxide protection circuits, which are used to protect the gate oxides of field effect transistor (FET) elements from over voltage conditions, particularly during situations in which the gate oxides are particularly vulnerable, such as during certain manufacturing stages. Each gate oxide protection circuit may be coupled to a corresponding FET element through corresponding first and second resistive elements, which are coupled to a corresponding gate connection node and a corresponding first connection node, respectively, of the FET element. The gate connection node and the first connection node are electrically adjacent to opposite sides of the gate oxide of the FET element. Each gate oxide protection circuit may protect its corresponding FET element by limiting a voltage between the gate connection node and the first connection node.

15 Claims, 10 Drawing Sheets

(56) References Cited

OTHER PUBLICATIONS

Hook, Terence B. et al., "SO1 Charging Prevention: Chip-Level Net Tracing and Diode Protection," 2004 IEEE International Conference on Integrated Circuit Design and Technology, 2004, pp. 127-130, IEEE.

Hook, Terence B., "SOI Chip Design and Charging Damage," Integrated Circuit Design and Technology and Tutorial, 2008, pp. 83-86, IEEE.

Ioannou, D.P. et al., "Investigation of Plasma Charging Damage Impact on Device and Gate Dielectric Reliability in 180nm SOI CMOS RF Switch Technology," 47th Annual International Reliability Physics Symposium, 2009, pp. 1011-1013, IEEE.

Shin, Hyungcheol et al., "Impact of Plasma Charging Damage and Diode Protection on Scaled Thin Oxide," Electron Devices Meeting, 1993, pp. 467-470, IEEE.

* cited by examiner

REMOTE GATE PROTECTION DIODE FOR FIELD EFFECT TRANSISTORS

This application claims the benefit of provisional patent application Ser. No. 61/233,027, filed Aug. 11, 2009, the disclosure of which is hereby incorporated herein by reference in its entirety.

FIELD OF THE DISCLOSURE

Embodiments of the present disclosure relate to Field Effect Transistor (FET) elements and protection circuits relating to FET elements, which may be used in Radio Frequency (RF) switches, or in other applications.

BACKGROUND OF THE DISCLOSURE

"Charging damage" or "plasma damage" may degrade gate oxide of complementary metal oxide semiconductor (CMOS) devices during wafer processing. During certain process steps, charge may be collected by circuit electrodes exposed during that process step, which may induce currents to flow in the partially formed circuit. If a large driving force is created that forces a current to flow through the gate oxide, then permanent damage may occur. In traditional CMOS logic circuits, a gate-protection diode may be coupled between a gate and a substrate. However, for isolated FET elements, such as floating body or body contacted FET elements, the substrate is isolated from the FET elements, thereby precluding use of traditional gate-protection diodes. Floating body or body contacted FET elements may be used to form RF switches, in which each FET element needs good RF isolation from adjacent devices for good RF performance, such as low harmonic distortion. An RF switch may have one or more large metal pads, which may be used for providing connections to the RF switch. However, such large metal pads may also inadvertently function as a "charging antenna," which may collect damaging energy due to wafer processing. It may be possible to use a remote gate-protection diode that is coupled between the gate and another node of the isolated FET via metallic interconnects to limit the voltage across the gate oxide. However, such a diode placement would typically introduce RF coupling to adjacent circuits, thereby degrading harmonic performance of the RF switch. Thus, there is a need for a technique to protect the gate oxides of isolated FET elements during certain steps of wafer processing that doesn't degrade performance of devices formed from the isolated FET elements, such as RF switches.

SUMMARY OF THE EMBODIMENTS

The present disclosure relates to gate oxide protection circuits, which are used to protect the gate oxides of field effect transistor (FET) elements from over voltage conditions, particularly during situations in which the gate oxides are particularly vulnerable, such as during certain manufacturing stages. Each gate oxide protection circuit may be coupled to a corresponding FET element through corresponding first and second resistive elements, which are coupled to a corresponding gate connection node and a corresponding first connection node, respectively, of the FET element. The gate connection node and the first connection node are electrically adjacent to opposite sides of the gate oxide of the FET element. Each gate oxide protection circuit may protect its corresponding FET element by limiting a voltage between the gate connection node and the first connection node. Further, each gate oxide protection circuit may include at least one diode coupled between the corresponding first and second resistive elements.

By coupling the gate oxide protection circuit to the FET element through the first and the second resistive elements, any RF coupling to the gate oxide protection circuit from adjacent circuitry is attenuated by the first and the second resistive elements, thereby minimizing harmonic distortion. The first connection node may be coupled to a source or a drain of a floating body FET element, or the first connection node may be coupled to a source, a drain, or a body of a body contacted FET element.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION OF THE PREFERRED EMBODIMENTS

The embodiments set forth below represent the necessary information to enable those skilled in the art to practice the disclosure and illustrate the best mode of practicing the disclosure. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

The present disclosure relates to gate oxide protection circuits, which are used to protect the gate oxides of field effect transistor (FET) elements from over voltage conditions, particularly during situations in which the gate oxides are particularly vulnerable, such as during certain manufacturing stages. Each gate oxide protection circuit may be coupled to a corresponding FET element through corresponding first and second resistive elements, which are coupled to a corresponding gate connection node and a corresponding first connection node, respectively, of the FET element. The gate connection node and the first connection node are electrically adjacent to opposite sides of the gate oxide of the FET element. Each gate oxide protection circuit may protect its corresponding FET element by limiting a voltage between the gate connection node and the first connection node. Further, each gate oxide protection circuit may include at least one diode coupled between the corresponding first and second resistive elements.

By coupling the gate oxide protection circuit to the FET element through the first and the second resistive elements, any RF coupling to the gate oxide protection circuit from adjacent circuitry is attenuated by the first and the second resistive elements, thereby minimizing harmonic distortion. The first connection node may be coupled to a source or a drain of a floating body FET element, or the first connection node may be coupled to a source, a drain, or a body of a body contacted FET element.

Figure 1:
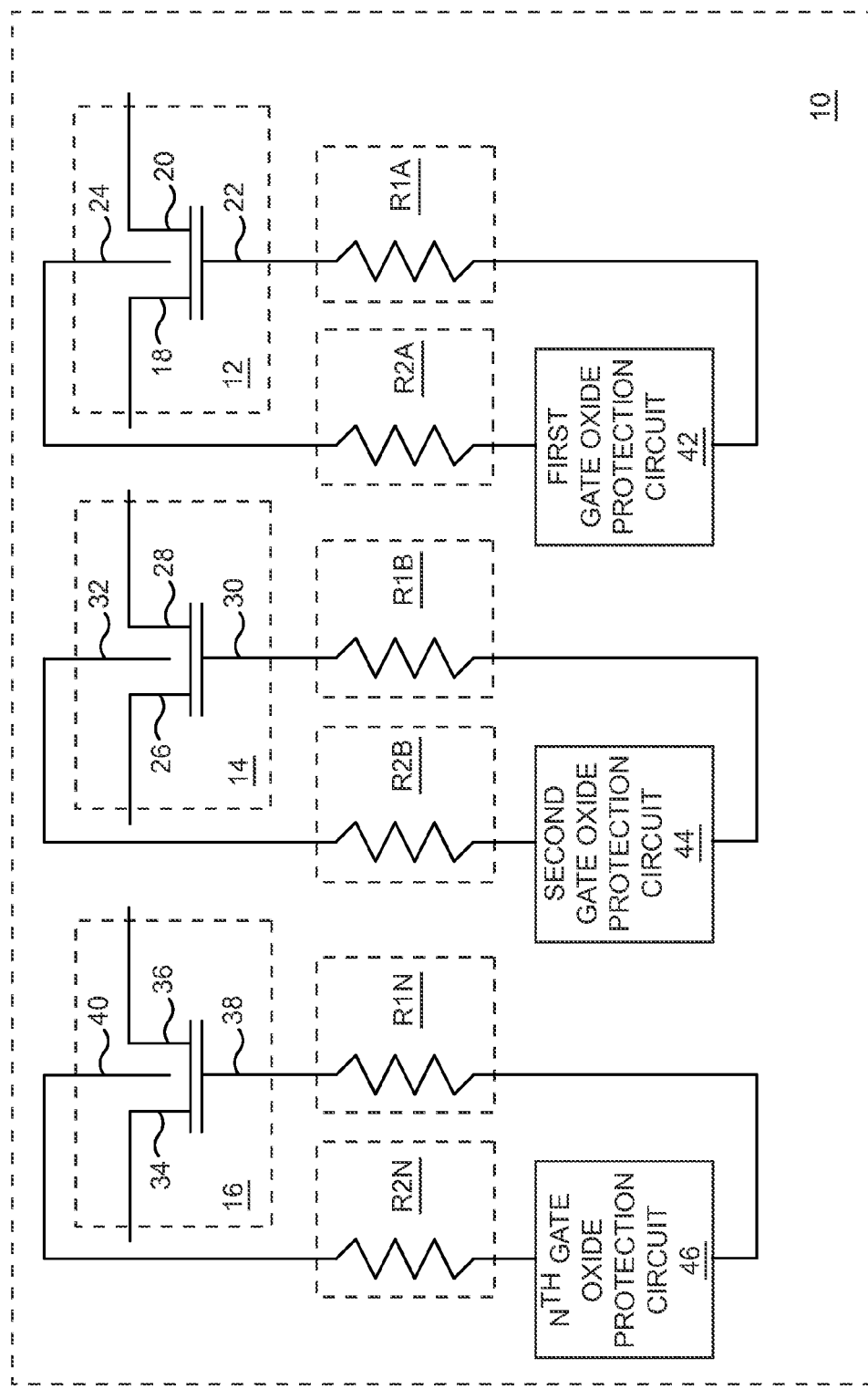
FIG. 1 shows a semiconductor die according to one embodiment of the semiconductor die.

FIG. 1 shows a semiconductor die 10 according to one embodiment of the semiconductor die 10. The semiconductor die 10 includes a first FET element 12, a second FET element 14, and up to and including an $N^{TH}$ FET element 16. The first FET element 12 has a first source 18, a first drain 20, a first gate 22, and a first body 24, which in general may be either floating or body contacted. The second FET element 14 has a second source 26, a second drain 28, a second gate 30, and a second body 32, which in general may be either floating or body contacted. The $N^{TH}$ FET element 16 has an $N^{TH}$ source 34, an $N^{TH}$ drain 36, an $N^{TH}$ gate 38, and an $N^{TH}$ body 40, which in general may be either floating or body contacted. The semiconductor die 10 further includes a first gate oxide protection circuit 42, a second gate oxide protection circuit 44, and up to and including an $N^{TH}$ gate oxide protection circuit 46. Additionally, the semiconductor die 10 includes a first alpha resistive element R1A, a second alpha resistive element R2A, a first beta resistive element R1B, a second beta resistive element R2B, and up to and including a first $N^{TH}$ resistive element R1N and a second $N^{TH}$ resistive element R2N.

In the embodiment of the semiconductor die 10 illustrated in FIG. 1, the FET elements 12, 14, 16 are body contacted, such that each of the FET elements 12, 14, 16 are body contacted FET elements. As such, the first alpha resistive element R1A is coupled between the first gate oxide protection circuit 42 and the first gate 22, and the second alpha resistive element R2A is coupled between the first gate oxide protection circuit 42 and the first body 24. The first beta resistive element R1B is coupled between the second gate oxide protection circuit 44 and the second gate 30, and the second beta resistive element R2B is coupled between the second gate oxide protection circuit 44 and the second body 32. The first $N^{TH}$ resistive element R1N is coupled between the $N^{TH}$ gate oxide protection circuit 46 and the $N^{TH}$ gate 38, and the second $N^{TH}$ resistive element R2N is coupled between the $N^{TH}$ gate oxide protection circuit 46 and the $N^{TH}$ body 40.

In general, each of the first resistive elements R1A, R1B, R1N is coupled between a gate connection node (not shown) of a corresponding one of the FET elements 12, 14, 16 and a corresponding one of the gate oxide protection circuits 42, 44, 46. Each gate connection node is coupled to a corresponding one of the gates 22, 30, 38. Each of the second resistive elements R2A, R2B, R2N is coupled between a first connection node (not shown) of a corresponding one of the FET elements 12, 14, 16 and a corresponding one of the gate oxide protection circuits 42, 44, 46. In the embodiment of the semiconductor die 10 illustrated in FIG. 1, each first connection node is coupled to a corresponding one of the bodies 24, 32, 40. In an alternate embodiment of the semiconductor die 10 (not shown), each first connection node is coupled to a corresponding one of the sources 18, 26, 34. In an additional embodiment of the semiconductor die 10 (not shown), each first connection node is coupled to a corresponding one of the drains 20, 28, 36. The gate oxide protection circuits 42, 44, 46 may protect gate oxide (not shown) of corresponding FET elements 12, 14, 16 by limiting a voltage between the gate connection node and the first connection node of each of the corresponding FET elements 12, 14, 16.

Figure 2:
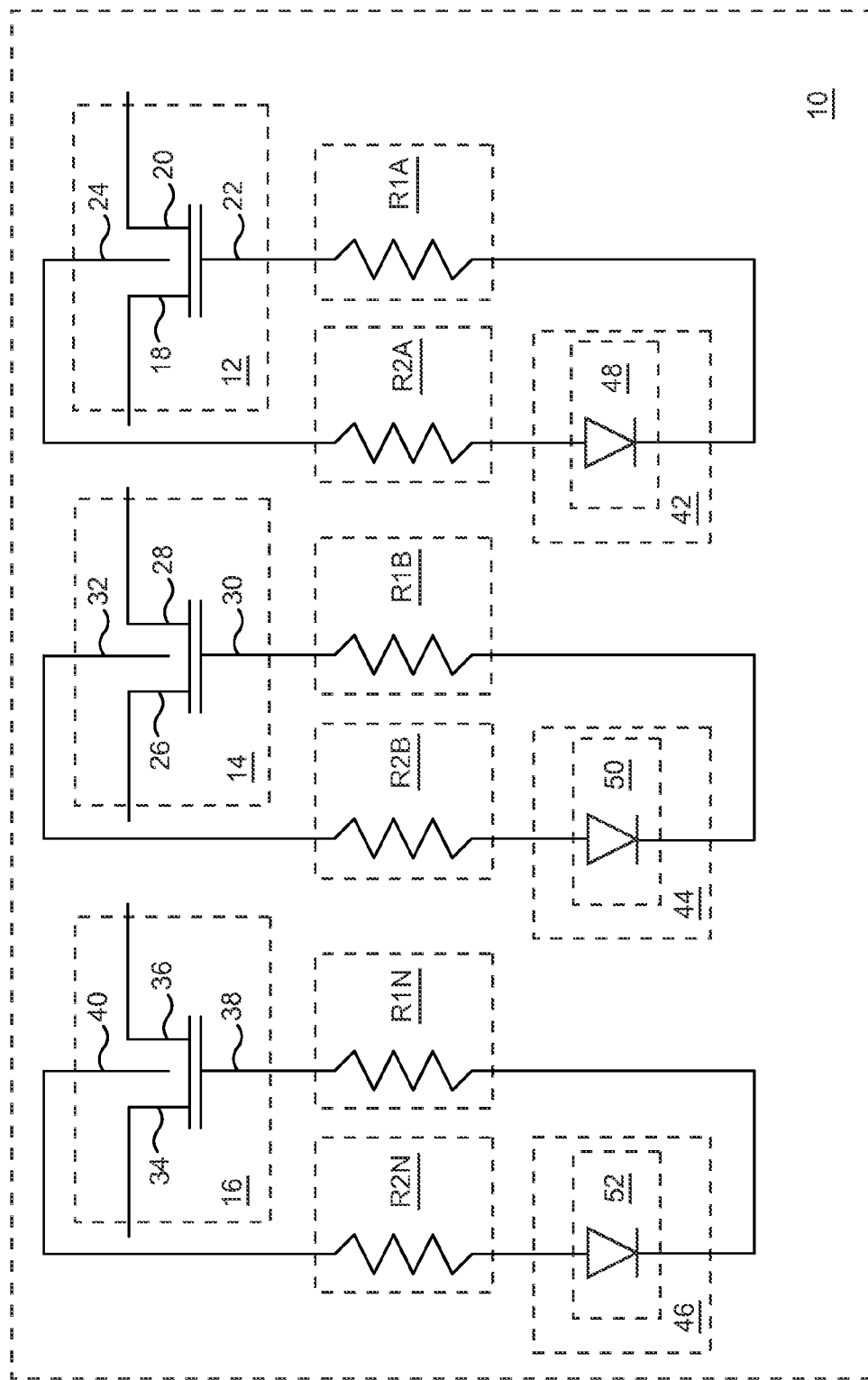
FIG. 2 shows details of a first gate oxide protection circuit, a second gate oxide protection circuit, and an $N^{TH}$ gate oxide protection circuit illustrated in FIG. 1 according to one embodiment of the first gate oxide protection circuit, the second gate oxide protection circuit, and the $N^{TH}$ gate oxide protection circuit.

FIG. 2 shows details of the first gate oxide protection circuit 42, the second gate oxide protection circuit 44, and the $N^{TH}$ gate oxide protection circuit 46 illustrated in FIG. 1 according to one embodiment of the first gate oxide protection circuit 42, the second gate oxide protection circuit 44, and the $N^{TH}$ gate oxide protection circuit 46. The semiconductor die 10 illustrated in FIG. 2 is similar to the semiconductor die 10 illustrated in FIG. 1, except in the semiconductor die 10 illustrated in FIG. 2, the first gate oxide protection circuit 42 includes a first diode element 48, the second gate oxide protection circuit 44 includes a second diode element 50, and the $N^{TH}$ gate oxide protection circuit 46 includes an $N^{TH}$ diode element 52. In the semiconductor die 10 illustrated in FIG. 2, a cathode of the first diode element 48 is coupled to the first alpha resistive element R1A and an anode of the first diode element 48 is coupled to the second alpha resistive element R2A; a cathode of the second diode element 50 is coupled to the first beta resistive element R1B and an anode of the second diode element 50 is coupled to the second beta resistive element R2B; and a cathode of the $N^{TH}$ diode element 52 is coupled to the first $N^{TH}$ resistive element R1N and an anode of the $N^{TH}$ diode element 52 is coupled to the second $N^{TH}$ resistive element R2N. In general, a cathode of each of the diode elements 48, 50, 52 is coupled to a corresponding one of the first resistive elements R1A, R1B, R1N and an anode of each of the diode elements 48, 50, 52 is coupled to a corresponding one of the second resistive elements R2A, R2B, R2N.

In another embodiment of the semiconductor die 10 (not shown), the anode of the first diode element 48 is coupled to the first alpha resistive element R1A and the cathode of the first diode element 48 is coupled to the second alpha resistive element R2A; the anode of the second diode element 50 is coupled to the first beta resistive element R1B and the cathode of the second diode element 50 is coupled to the second beta resistive element R2B; and the anode of the $N^{TH}$ diode element 52 is coupled to the first $N^{TH}$ resistive element R1N and the cathode of the $N^{TH}$ diode element 52 is coupled to the second $N^{TH}$ resistive element R2N. In general, an anode of each of the diode elements 48, 50, 52 is coupled to a corresponding one of the first resistive elements R1A, R1B, R1N and a cathode of each of the diode elements 48, 50, 52 is coupled to a corresponding one of the second resistive elements R2A, R2B, R2N.

Figure 3:
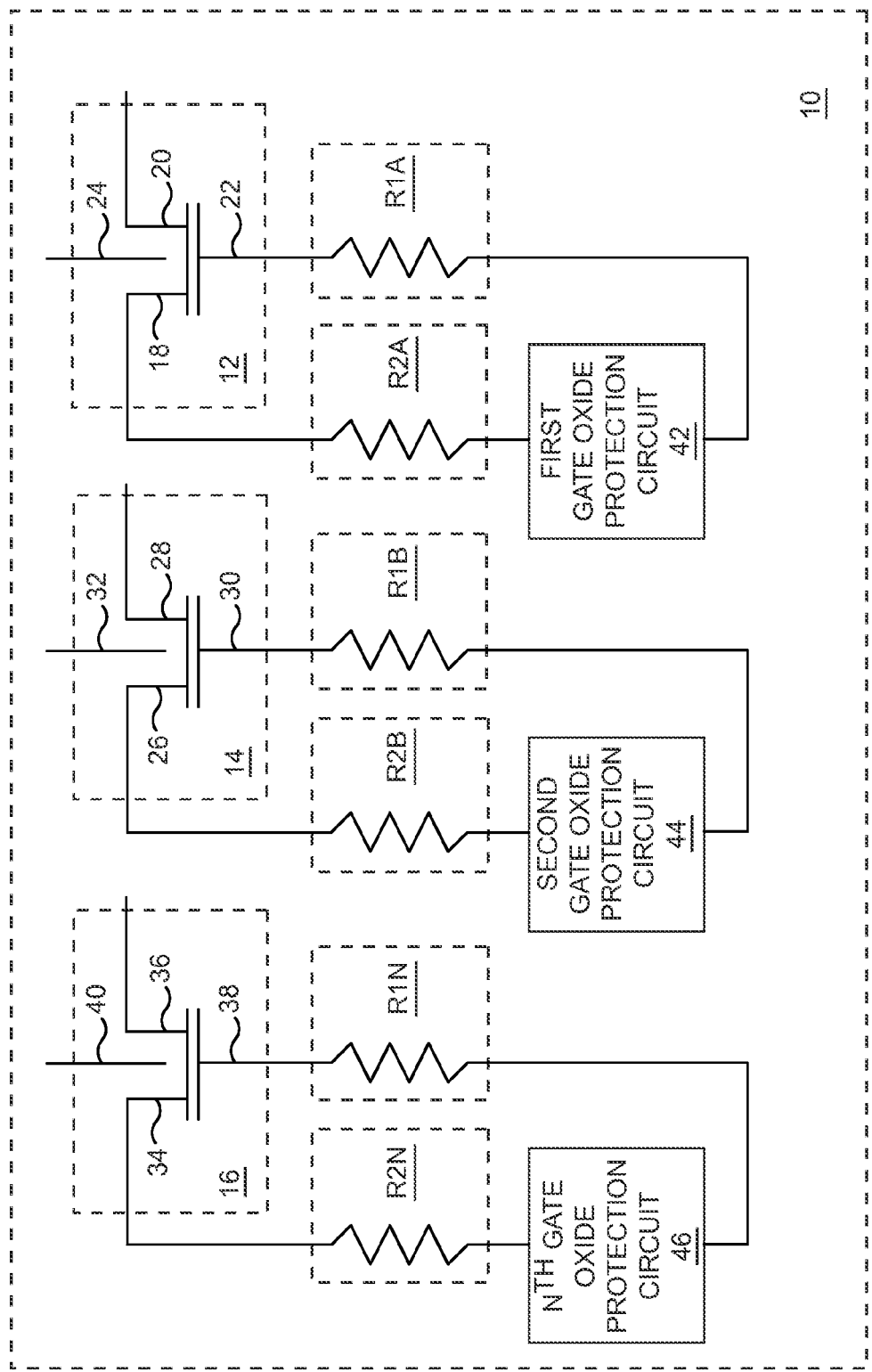
FIG. 3 shows the semiconductor die according to an alternate embodiment of the semiconductor die.

FIG. 3 shows the semiconductor die 10 according to an alternate embodiment of the semiconductor die 10. The semiconductor die 10 illustrated in FIG. 3 is similar to the semiconductor die 10 illustrated in FIG. 1, except in the semiconductor die 10 illustrated in FIG. 3, the second alpha resistive element R2A is coupled to the first source 18 instead of being coupled to the first body 24, the second beta resistive element R2B is coupled to the second source 26 instead of being coupled to the second body 32, and the second $N^{TH}$ resistive element R2N is coupled to the $N^{TH}$ source 34 instead of being coupled to the $N^{TH}$ body 40. As such, in a first exemplary embodiment of the FET elements 12, 14, 16, each of the FET elements 12, 14, 16 is a body contacted FET element. In a second exemplary embodiment of the FET elements 12, 14, 16, the FET elements 12, 14, 16 have floating bodies 24, 32, 40. In general, the first connection node of each of the FET elements 12, 14, 16 is coupled to a corresponding source of each of the FET elements 12, 14, 16. In another embodiment of the semiconductor die 10 (not shown), the first connection node of each of the FET elements 12, 14, 16 is coupled to a corresponding drain of each of the FET elements 12, 14, 16.

Figure 4:
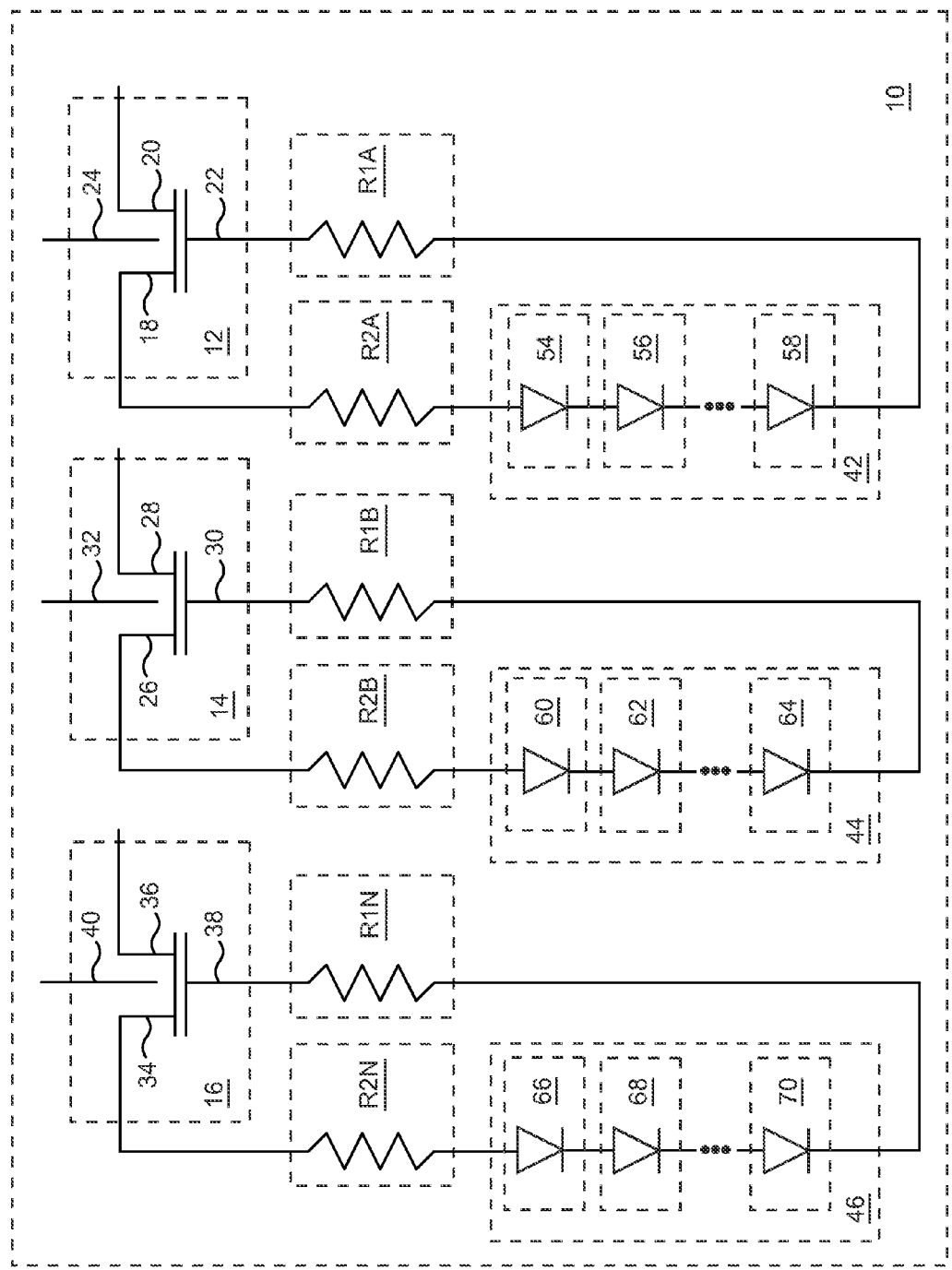
FIG. 4 shows details of the first gate oxide protection circuit, the second gate oxide protection circuit, and the $N^{TH}$ gate oxide protection circuit illustrated in FIG. 3 according to an alternate embodiment of the first gate oxide protection circuit, the second gate oxide protection circuit, and the $N^{TH}$ gate oxide protection circuit 46.

FIG. 4 shows details of the first gate oxide protection circuit 42, the second gate oxide protection circuit 44, and the $N^{TH}$ gate oxide protection circuit 46 illustrated in FIG. 3 according to an alternate embodiment of the first gate oxide protection circuit 42, the second gate oxide protection circuit 44, and the $N^{TH}$ gate oxide protection circuit 46. The semiconductor die 10 illustrated in FIG. 4 is similar to the semiconductor die 10 illustrated in FIG. 3, except in the semiconductor die 10 illustrated in FIG. 24, the first gate oxide protection circuit 42 includes a first alpha diode element 54, a second alpha diode element 56, and up to and including an $M^{TH}$ alpha diode element 58; the second gate oxide protection circuit 44 includes a first beta diode element 60, a second beta diode element 62, and up to and including an $M^{TH}$ beta diode element 64; and the $N^{TH}$ gate oxide protection circuit 46 includes a first $N^{TH}$ diode element 66, a second $N^{TH}$ diode element 68, and up to and including an $M^{TH} N^{TH}$ diode element 70. The alpha diode elements 54, 56, 58 are coupled in series between the first alpha resistive element R1A and the second alpha resistive element R2A; the beta diode elements 60, 62, 64 are coupled in series between the first beta resistive element R1B and the second beta resistive element R2B; and the $N^{TH}$ diode elements 66, 68, 70 are coupled in series between the first $N^{TH}$ resistive element R1N and the second $N^{TH}$ resistive element R2N.

In the semiconductor die 10 illustrated in FIG. 4, a cathode of the $M^{TH}$ alpha diode element 58 is coupled to the first alpha resistive element R1A and an anode of the first alpha diode element 54 is coupled to the second alpha resistive element R2A; a cathode of the $M^{TH}$ beta diode element 64 is coupled to the first beta resistive element R1B and an anode of the first beta diode element 60 is coupled to the second beta resistive element R2B; and a cathode of the $M^{TH} N^{TH}$ diode element 70 is coupled to the first $N^{TH}$ resistive element R1N and an anode of the first $N^{TH}$ diode element 66 is coupled to the second $N^{TH}$ resistive element R2N. In general, a cathode of one of the alpha diode elements 54, 56, 58 is coupled to the first alpha resistive element R1A and an anode of another of the alpha diode elements 54, 56, 58 is coupled to the second alpha resistive element R2A; a cathode of one of the beta diode elements 60, 62, 64 is coupled to the first beta resistive element R1B and an anode of another of the beta diode elements 60, 62, 64 is coupled to the second beta resistive element R2B; and a cathode of one of the $N^{TH}$ diode elements 66, 68, 70 is coupled to the first $N^{TH}$ resistive element R1N and an anode of another of the $N^{TH}$ diode elements 66, 68, 70 is coupled to the second $N^{TH}$ resistive element R2N.

In another embodiment of the semiconductor die 10 (not shown), an anode of one of the alpha diode elements 54, 56, 58 is coupled to the first alpha resistive element R1A and a cathode of another of the alpha diode elements 54, 56, 58 is coupled to the second alpha resistive element R2A; an anode of one of the beta diode elements 60, 62, 64 is coupled to the first beta resistive element R1B and a cathode of another of the beta diode elements 60, 62, 64 is coupled to the second beta resistive element R2B; and an anode of one of the $N^{TH}$ diode elements 66, 68, 70 is coupled to the first $N^{TH}$ resistive element R1N and a cathode of another of the $N^{TH}$ diode elements 66, 68, 70 is coupled to the second $N^{TH}$ resistive element R2N.

Figure 5:
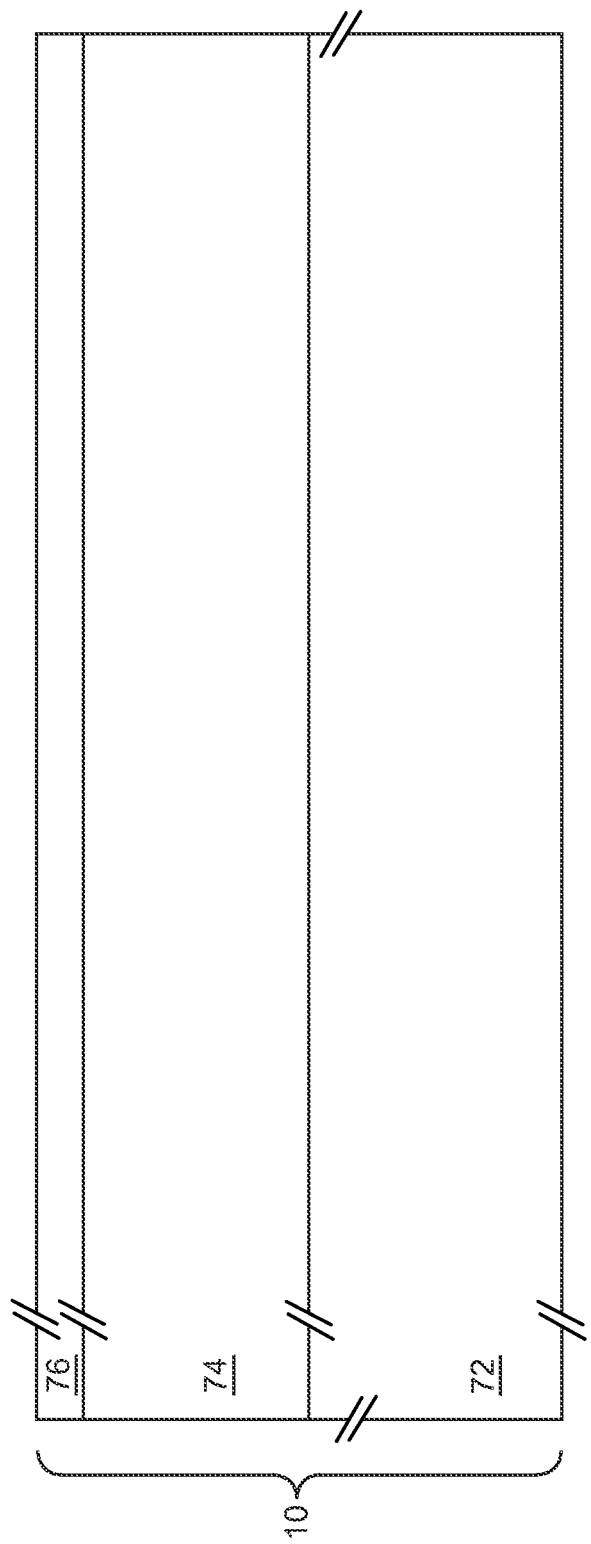
FIG. 5 shows a cross-section of the semiconductor die according to one embodiment of the semiconductor die.

FIG. 5 shows a cross-section of the semiconductor die 10, which may be a thin-film semiconductor die, a silicon-on-insulator (SOI) semiconductor die, a thin-film SOI semiconductor die, a thick-film SOI semiconductor die, or the like according to different embodiments of the semiconductor die 10. The semiconductor die 10 includes a substrate 72, which may be an SOI substrate; an insulating layer 74, which may be an SOI insulating layer, over the substrate 72; and a semiconductor device layer 76, which may be a thin-film device layer, an SOI device layer, a thin-film SOI device layer, a thick-film SOI device layer, or the like, over the insulating layer 74. The substrate 72 may include silicon, sapphire, other semiconductor material, insulating material, or any combination thereof. The substrate 72 may be provided from a silicon handle wafer. The insulating layer 74 may include oxide, buried oxide, silicon dioxide, other insulating material, or any combination thereof. The semiconductor device layer 76 may include silicon and may be used to form electronic devices, such as transistor elements, diode elements, resistive elements, capacitive elements, or the like. The insulating layer 74 may be used to electrically isolate the semiconductor device layer 76 from the substrate 72.

In one embodiment of the semiconductor device layer 76, the semiconductor device layer 76 is a thin-film SOI device layer, which is partially-depleted SOI and not fully-depleted SOI. In an alternate embodiment of the semiconductor device layer 76, the semiconductor device layer 76 is a thin-film SOI device layer, which is fully-depleted SOI. As the thickness of the insulating layer 74 increases, RF coupling to adjacent devices through the substrate 72 may be reduced, thereby improving isolation. Additionally, as resistivity of the substrate 72 increases, RF coupling to adjacent devices may be reduced, thereby improving RF performance of active RF devices and passive RF devices, such as inductors and transmission lines.

In a first exemplary embodiment of the substrate 72, resistivity of the substrate 72 is greater than about 100 ohm-centimeters. In a second exemplary embodiment of the substrate 72, the resistivity of the substrate 72 is greater than about 500 ohm-centimeters. In a third exemplary embodiment of the substrate 72, the resistivity of the substrate 72 is greater than about 1000 ohm-centimeters. In one embodiment of the semiconductor die 10, a thickness of the insulating layer 74 is greater than a thickness of the semiconductor device layer 76. In a first exemplary embodiment of the semiconductor device layer 76, the thickness of the semiconductor device layer 76 is between about 100 nanometers and about 300 nanometers. In a second exemplary embodiment of the semiconductor device layer 76, the thickness of the semiconductor device layer 76 is less than about 900 nanometers. In a third exemplary embodiment of the semiconductor device layer 76, the thickness of the semiconductor device layer 76 is less than about 700 nanometers. In a fourth exemplary embodiment of the semiconductor device layer 76, the thickness of the semiconductor device layer 76 is less than about 500 nanometers. In a fifth exemplary embodiment of the semiconductor device layer 76, the thickness of the semiconductor device layer 76 is less than about 300 nanometers. In a sixth exemplary embodiment of the semiconductor device layer 76, the thickness of the semiconductor device layer 76 is less than about 200 nanometers. In a seventh exemplary embodiment of the semiconductor device layer 76, the thickness of the semiconductor device layer 76 is less than about 100 nanometers.

In a first exemplary embodiment of the insulating layer 74, the thickness of the insulating layer 74 is between about 200 nanometers and about 1000 nanometers. In a second exemplary embodiment of the insulating layer 74, the thickness of the insulating layer 74 is greater than about 200 nanometers. In a third exemplary embodiment of the insulating layer 74, the thickness of the insulating layer 74 is greater than about 600 nanometers. In a fourth exemplary embodiment of the insulating layer 74, the thickness of the insulating layer 74 is greater than about 1000 nanometers. In a fifth exemplary embodiment of the insulating layer 74, the thickness of the insulating layer 74 is greater than about 1500 nanometers. In a sixth exemplary embodiment of the insulating layer 74, the thickness of the insulating layer 74 is greater than about 2000 nanometers.

Figure 6:
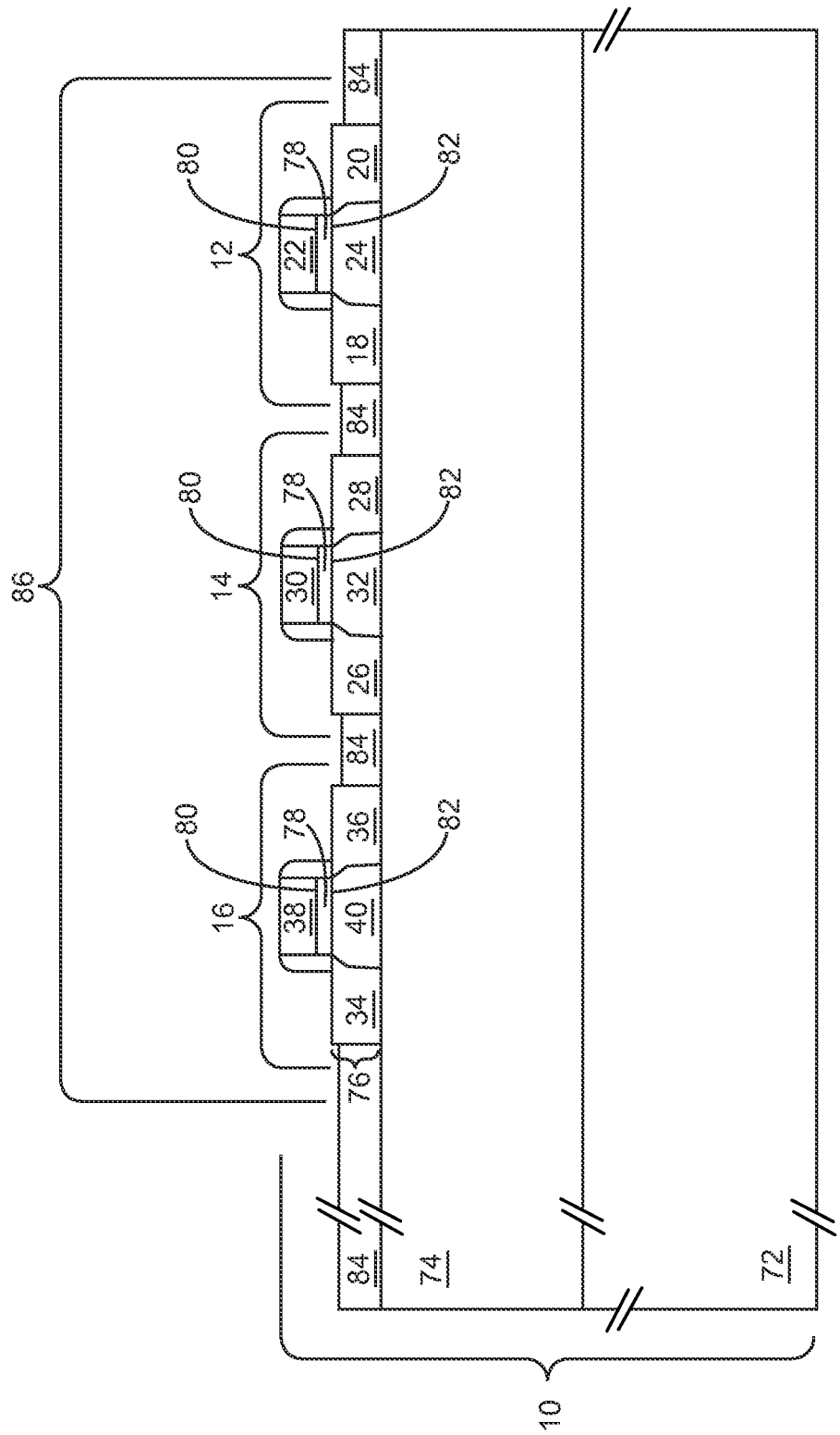
FIG. 6 shows a cross-section of the semiconductor die according to one embodiment of the semiconductor die.

FIG. 6 shows a cross-section of the semiconductor die 10 according to one embodiment of the semiconductor die 10. The semiconductor die 10 includes the substrate 72, the insulating layer 74, the semiconductor device layer 76, and the FET elements 12, 14, 16. Portions of the FET elements 12, 14, 16 are formed from the semiconductor device layer 76. Specifically, the first drain 20, the first body 24, the first source 18, the second drain 28, the second body 32, the second source 26, the $N^{TH}$ drain 36, the $N^{TH}$ body 40, and the $N^{TH}$ source 34 are formed from the semiconductor device layer 76. The first body 24 is between the first source 18 and the first drain 20, the second body 32 is between the second source 26 and the second drain 28, and the $N^{TH}$ body 40 is between the $N^{TH}$ source 34 and the $N^{TH}$ drain 36. The first gate 22 is over the first body 24, the second gate 30 is over the second body 32, and the $N^{TH}$ gate 38 is over the $N^{TH}$ body 40. Gate oxide 78 is between the bodies 24, 32, 40 and the gates 22, 30, 38. The gate oxide 78 has a first side 80 and a second side 82. The first side 80 is electrically adjacent to each gate connection node (not shown) via corresponding gates 22, 30, 38. The second side 82 is electrically adjacent to each first connection node (not shown) via corresponding sources 18, 26, 34, via corresponding bodies 24, 32, 40, via corresponding drains 20, 28, 36, or any combination thereof.

A lateral isolation region 84 may laterally isolate the FET elements 12, 14, 16 from one another and form other components, and the insulating layer 74 may vertically isolate the FET elements 12, 14, 16 from the substrate 72. In one embodiment of the semiconductor die 10, the FET elements 12, 14, 18 are coupled in series to form an RF switch 86.

Figure 7:
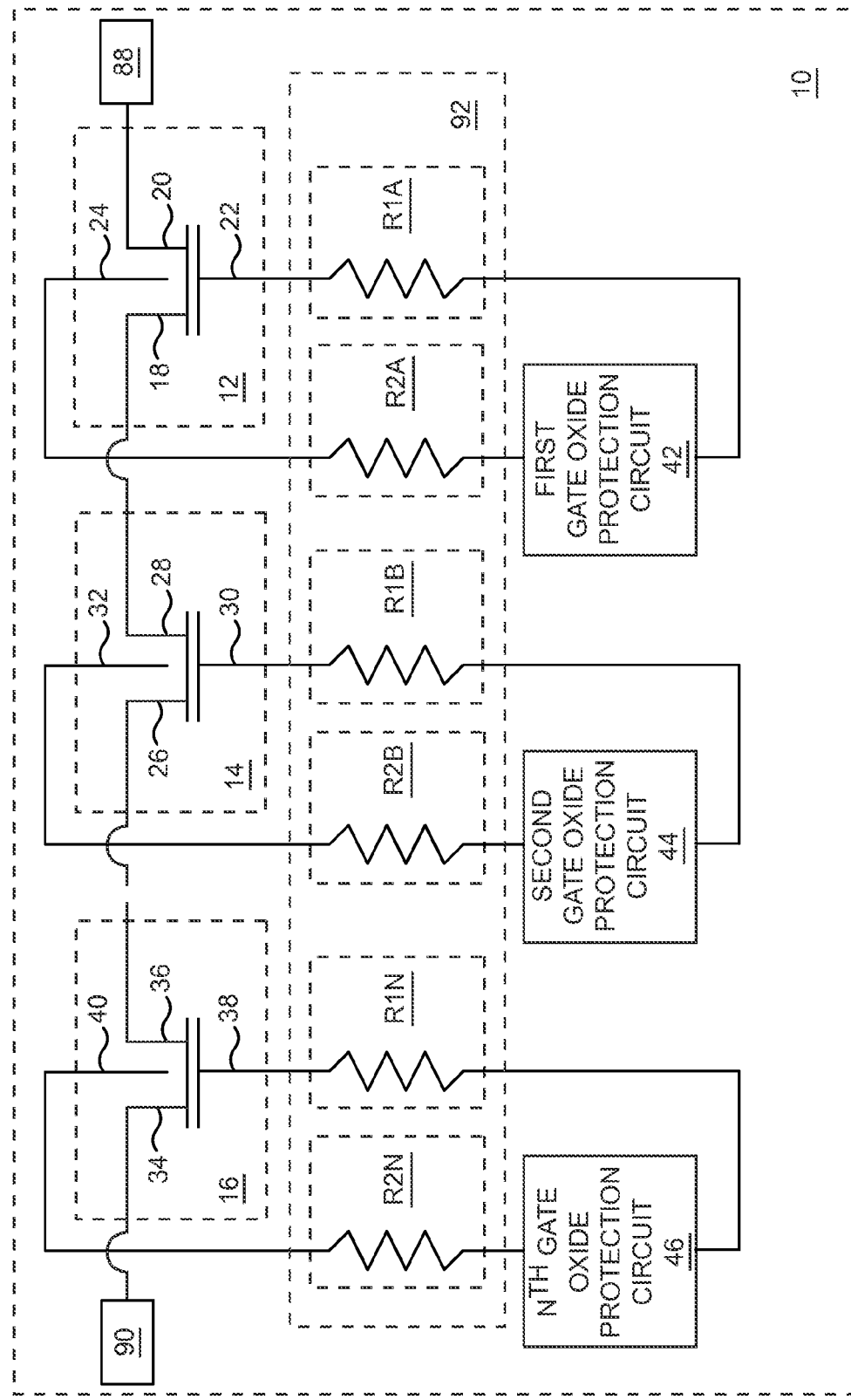
FIG. 7 is a schematic diagram relating to one embodiment of an RF switch illustrated in FIG. 6.

FIG. 7 is a schematic diagram relating to one embodiment of the RF switch 86 illustrated in FIG. 6. The RF switch 86 includes the FET elements 12, 14, 16 coupled between a first RF switch connection node 88 and a second RF switch connection node 90. Further, a resistor bias network 92 may provide appropriate bias signals to the FET elements 12, 14, 16 for proper operation of the RF switch 86. As such, the resistor bias network 92 may include the first alpha resistive element R1A, the second alpha resistive element R2A, the first beta resistive element R1B, the second beta resistive element R2B, the first $N^{TH}$ resistive element R1N, and the second $N^{TH}$ resistive element R2N.

Figure 8:
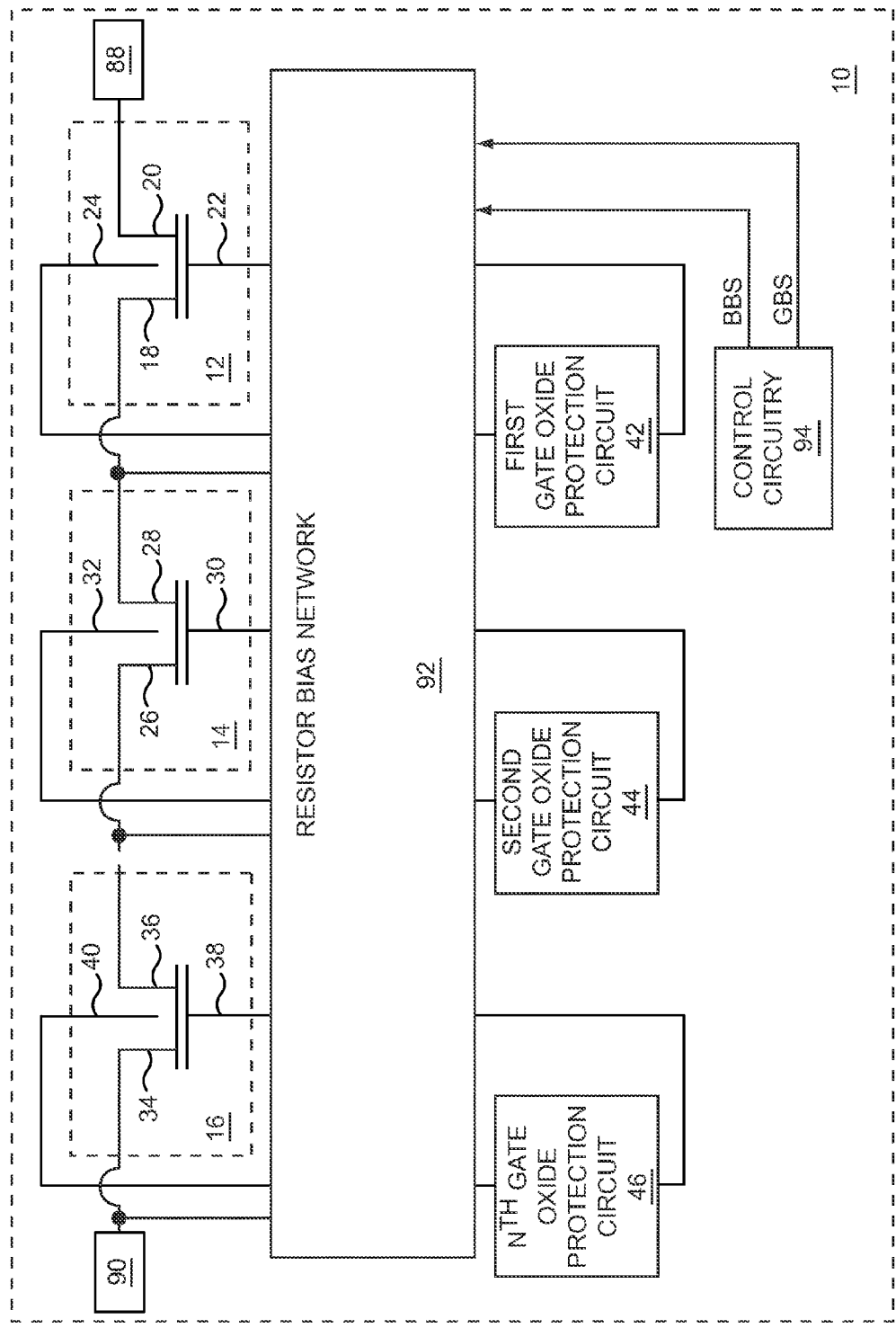
FIG. 8 is a schematic diagram relating to an alternate embodiment of the RF switch illustrated in FIG. 7.

FIG. 8 is a schematic diagram relating to an alternate embodiment of the RF switch 86 illustrated in FIG. 7. The RF switch 86 illustrated in FIG. 8 is similar to the RF switch 86 illustrated in FIG. 7, except in the RF switch 86 illustrated in FIG. 8, the resistor bias network 92 is shown in a generalized form and the semiconductor die 10 further includes control circuitry 94, which provides a body bias signal BBS to each of the FET elements 12, 14, 16 via the resistor bias network 92 and a gate bias signal GBS to each of the FET elements via the resistor bias network 92. The control circuitry 94 may select between an ON state of the RF switch 86 and an OFF state of the RF switch 86.

In one embodiment of the RF switch 86, the FET elements are body contacted. As such, during the OFF state of the RF switch 86, the control circuitry 94 may provide the body bias signal BBS, such that each body and each corresponding source of the FET elements 12, 14, 16 are reverse biased and each body and each corresponding drain of the FET elements 12, 14, 16 are reverse biased to provide reverse body biasing of the FET elements 12, 14, 16 of the RF switch 86. Further, during the OFF state of the RF switch 86, the control circuitry 94 may provide the body bias signal BBS and the gate bias signal GBS, such that a voltage at each gate of the FET elements 12, 14, 16 is about equal to a voltage at each corresponding body of the FET elements 12, 14, 16.

In a first exemplary embodiment of the RF switch 86, during the OFF state, the voltage at the bodies 24, 32, 40 of the FET elements 12, 14, 16 is about equal to −2.5 volts DC and the voltage at the gates 22, 30, 38 of the FET elements 12, 14, 16 is about equal to −2.5 volts DC. As such, the diode elements 48, 50, 52 illustrated in FIG. 2 have no bias voltage across them. During the ON state, the voltage at the bodies 24, 32, 40 of the FET elements 12, 14, 16 is about equal to 0 volts DC and the voltage at the gates 22, 30, 38 of the FET elements 12, 14, 16 is about equal to 2.5 volts DC. As such, the diode elements 48, 50, 52 illustrated in FIG. 2 are reverse biased.

In a second exemplary embodiment of the RF switch 86, the FET elements 12, 14, 16 have floating bodies 24, 32, 40. As such, during the OFF state of the RF switch 86, the control circuitry 94 may provide the gate bias signal GBS, such that the voltage at the gates 22, 30, 38 of the FET elements 12, 14, 16 is equal to about −2.5 volts DC and the voltage at the sources 18, 26, 34 of the FET elements 12, 14, 16 is equal to about zero volts DC. Therefore, the alpha diode elements 54, 56, 58, the beta diode elements 60, 62, 64, and the $N^{TH}$ diode elements 66, 68, 70 illustrated in FIG. 4 have a forward voltage applied. However, if the number of series coupled diode elements is sufficiently large, such as three or greater, the alpha diode elements 54, 56, 58, the beta diode elements 60, 62, 64, and the $N^{TH}$ diode elements 66, 68, 70 will not become forward biased. During the ON state of the RF switch 86, the control circuitry 94 may provide the gate bias signal GBS, such that the voltage at the gates 22, 30, 38 of the FET elements 12, 14, 16 is equal to about 2.5 volts DC and the voltage at the sources 18, 26, 34 of the FET elements 12, 14, 16 is equal to about zero volts DC. Therefore, the alpha diode elements 54, 56, 58, the beta diode elements 60, 62, 64, and the $N^{TH}$ diode elements 66, 68, 70 illustrated in FIG. 4 are reverse biased.

Figure 9:
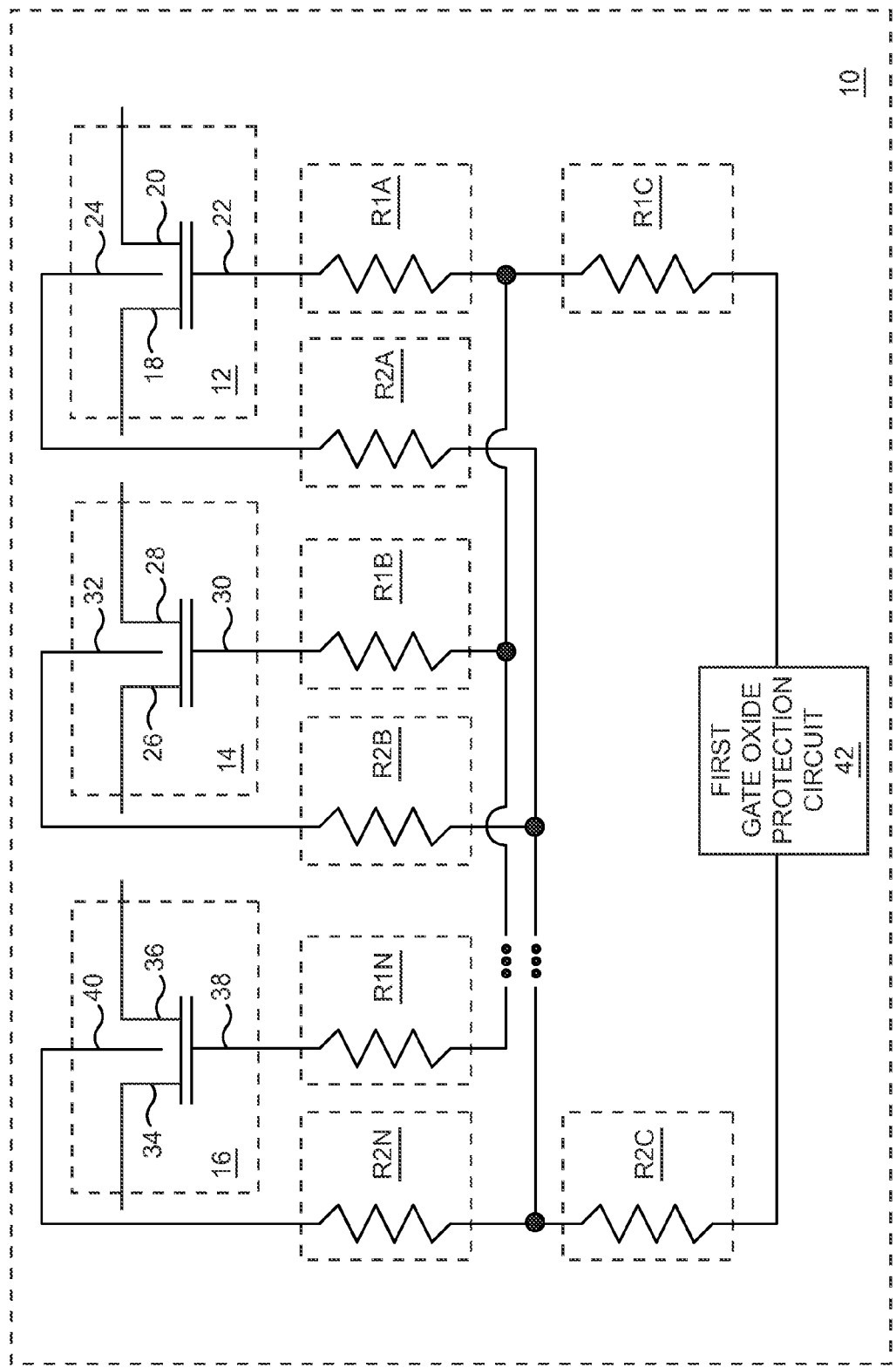
FIG. 9 shows the semiconductor die according to an additional embodiment of the semiconductor die.

FIG. 9 shows the semiconductor die 10 according to an additional embodiment of the semiconductor die 10. The semiconductor die 10 illustrated in FIG. 9 is similar to the semiconductor die 10 illustrated in FIG. 1, except in the semiconductor die 10 illustrated in FIG. 9, the second and the $N^{TH}$ gate oxide protection circuits 44, 46 are omitted. The first resistive elements R1A, R1B, R1N are coupled to the first gate oxide protection circuit 42 through a first common resistive element R1C. The second resistive elements R2A, R2B, R2N are coupled to the first gate oxide protection circuit 42 through a second common resistive element R2C. As such, the first gate oxide protection circuit 42 protects gate oxide 78 of all of the FET elements 12, 14, 16.

Figure 10:
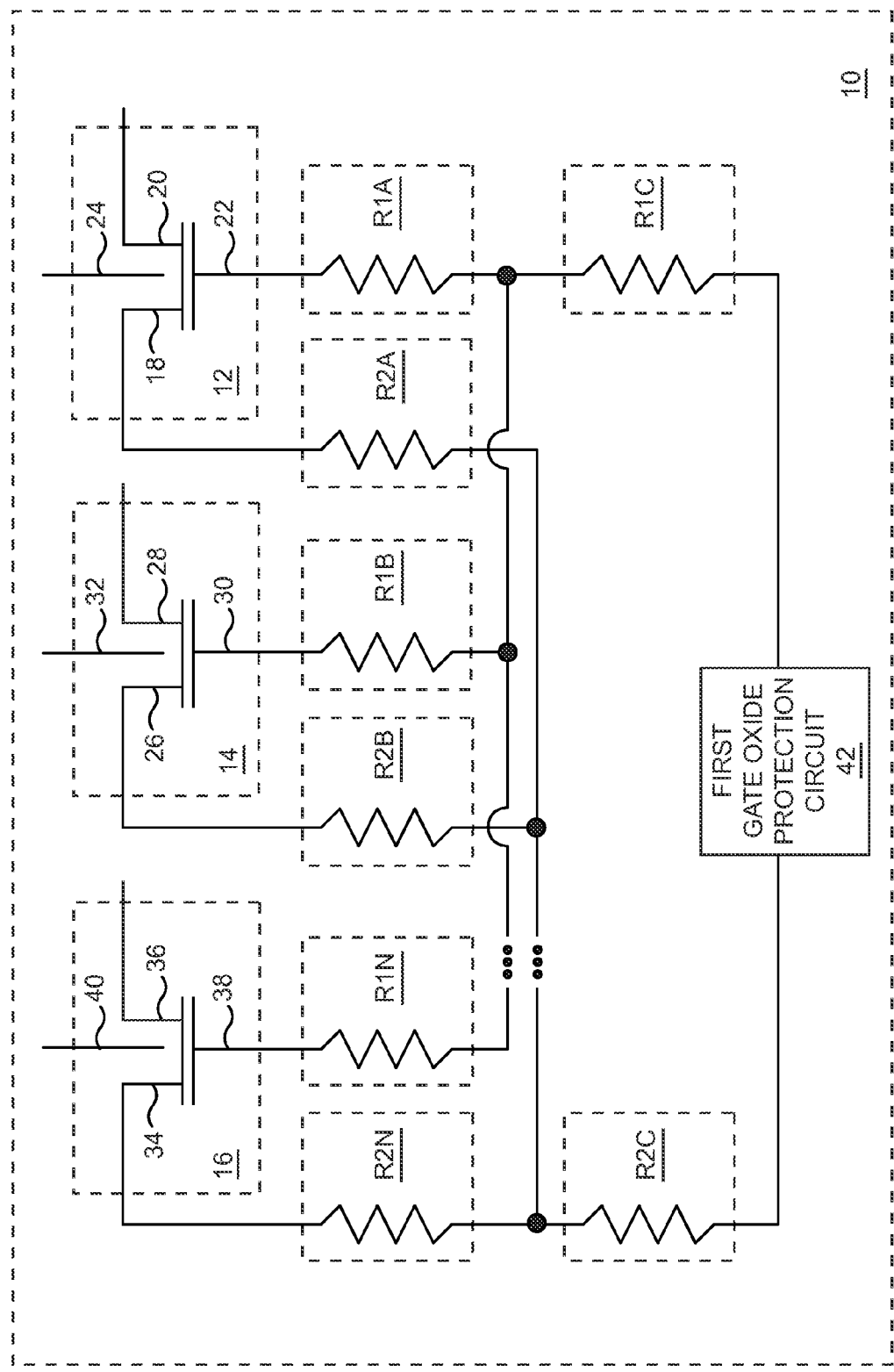
FIG. 10 shows the semiconductor die according to another embodiment of the semiconductor die.

FIG. 10 shows the semiconductor die 10 according to another embodiment of the semiconductor die 10. The semiconductor die 10 illustrated in FIG. 10 is similar to the semiconductor die 10 illustrated in FIG. 3, except in the semiconductor die 10 illustrated in FIG. 10, the second and the $N^{TH}$ gate oxide protection circuits 44, 46 are omitted. The first resistive elements R1A, R1B, R1N are coupled to the first gate oxide protection circuit 42 through the first common resistive element R1C. The second resistive elements R2A, R2B, R2N are coupled to the first gate oxide protection circuit 42 through the second common resistive element R2C. As such, the first gate oxide protection circuit 42 protects gate oxide 78 of all of the FET elements 12, 14, 16.

Some of the circuitry previously described may use discrete circuitry, integrated circuitry, programmable circuitry, non-volatile circuitry, volatile circuitry, software executing instructions on computing hardware, firmware executing instructions on computing hardware, the like, or any combination thereof. The computing hardware may include mainframes, micro-processors, micro-controllers, DSPs, the like, or any combination thereof.

None of the embodiments of the present disclosure are intended to limit the scope of any other embodiment of the present disclosure. Any or all of any embodiment of the present disclosure may be combined with any or all of any other embodiment of the present disclosure to create new embodiments of the present disclosure.

Those skilled in the art will recognize improvements and modifications to the preferred embodiments of the present disclosure. All such improvements and modifications are considered within the scope of the concepts disclosed herein and the claims that follow.

What is claimed is:

1. A semiconductor die comprising:
    a plurality of field effect transistor (FET) elements, such that each of the plurality of FET elements has gate oxide, a gate connection node, which is electrically coupled to a first side of the gate oxide, and a first connection node, which is electrically coupled to a second side of the gate oxide opposite the first side through one of a source connection node or a drain connection node;
    a gate oxide protection circuit coupled between a first gate oxide protection node and a second gate oxide protection node, the gate oxide protection circuit comprising at least one diode element;
    a first plurality of resistive elements coupled between the gate connection node of each one of the plurality of FET elements and the first gate oxide protection node;
    a second plurality of resistive elements coupled between the first connection node of each one of the plurality of FET elements and the second gate oxide protection node;
    a first common resistive element coupled between the first gate oxide protection node and the first plurality of resistive elements; and
    a second common resistive element coupled between the second gate oxide protection node and the second plurality of resistive elements,
    wherein the gate oxide protection circuit is configured to protect the gate oxide of each of the plurality of FET elements by limiting a voltage between the gate connection node and the first connection node of each of the plurality of FET elements.

2. The semiconductor die of claim 1 wherein each of the plurality of FET elements is a body contacted FET element.

3. The semiconductor die of claim 2 wherein the plurality of FET elements are coupled in series to form a radio frequency (RF) switch.

4. The semiconductor die of claim 3 further comprising control circuitry configured to during an OFF state of the RF switch, provide a body bias signal to the each body of the plurality of FET elements, such that the each body and each corresponding source of the plurality of FET elements are reverse biased and the each body and each corresponding drain of the plurality of FET elements are reverse biased to provide reverse body biasing of each of the plurality of FET elements.

5. The semiconductor die of claim 4 wherein during the OFF state of the RF switch, a voltage at each gate of the plurality of FET elements is about equal to a voltage at a corresponding body of the plurality of FET elements.

6. The semiconductor die of claim 1 wherein the at least one diode element comprises a plurality of diode elements coupled in series.

7. The semiconductor die of claim 6 wherein an anode of one of the plurality of diode elements is coupled to the first gate oxide protection node and a cathode of another of the plurality of diode elements is coupled to the second gate oxide protection node.

8. The semiconductor die of claim 6 wherein an anode of one of the plurality of diode elements is coupled to the second gate oxide protection node and a cathode of another of the plurality of diode elements is coupled to the first gate oxide protection node.

9. The semiconductor die of claim 1 wherein an anode of the at least one diode element is coupled to the first gate oxide protection node and a cathode of the at least one diode element is coupled to the second gate oxide protection node.

10. The semiconductor die of claim 1 wherein an anode of the at least one diode element is coupled to the second gate oxide protection node and a cathode of the at least one diode element is coupled to the first gate oxide protection node.

11. The semiconductor die of claim 1 further comprising:
    a substrate;
    an insulating layer over the substrate; and
    a semiconductor device layer over the insulating layer, such that the semiconductor device layer provides at least a portion of the plurality of FET elements.

12. The semiconductor die of claim 11 wherein the semiconductor die is a silicon-on-insulator (SOI) semiconductor die.

13. The semiconductor die of claim 12 wherein the semiconductor device layer is an SOI device layer.

14. The semiconductor die of claim 12 wherein the semiconductor device layer is a thin-film SOI device layer.

15. The semiconductor die of claim 11 wherein the semiconductor device layer is a thin-film device layer.

* * * * *